(12) United States Patent
Feng et al.

(10) Patent No.: US 11,581,438 B2
(45) Date of Patent: Feb. 14, 2023

(54) FIN STRUCTURE FOR FIN FIELD EFFECT TRANSISTOR AND METHOD FOR FABRICATION THE SAME

(71) Applicant: United Microelectronics Corp., Hsinchu (TW)

(72) Inventors: Hao Che Feng, Kaohsiung (TW); Hung Jen Huang, Tainan (TW); Hsin Min Han, Kaohsiung (TW); Shih-Wei Su, Tainan (TW); Ming Shu Chiu, Tainan (TW); Pi-Hung Chuang, Changhua County (TW); Wei-Hao Huang, New Taipei (TW); Shao-Wei Wang, Taichung (TW); Ping Wei Huang, Pingtung County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/992,061

(22) Filed: Aug. 12, 2020

(65) Prior Publication Data

US 2022/0052199 A1 Feb. 17, 2022

(51) Int. Cl.
| | | |
|---|---|---|
| *H01L 29/78* | (2006.01) | |
| *H01L 29/06* | (2006.01) | |
| *H01L 21/02* | (2006.01) | |
| *H01L 29/66* | (2006.01) | |
| *H01L 21/3105* | (2006.01) | |
| *H01L 21/311* | (2006.01) | |

(52) U.S. Cl.
CPC ...... *H01L 29/7854* (2013.01); *H01L 21/0217* (2013.01); *H01L 21/02247* (2013.01); *H01L 21/31053* (2013.01); *H01L 21/31111* (2013.01); *H01L 21/31144* (2013.01); *H01L 29/0649* (2013.01); *H01L 29/66818* (2013.01)

(58) Field of Classification Search
CPC .......... H01L 21/0217; H01L 21/02247; H01L 29/7854
See application file for complete search history.

(56) References Cited

U.S. PATENT DOCUMENTS

| | | | |
|---|---|---|---|
| 7,229,896 B2 | 6/2007 | Chen et al. | |
| 8,823,132 B2 | 9/2014 | Liou et al. | |
| 9,130,014 B2 | 9/2015 | Lin et al. | |
| 9,685,319 B2 | 6/2017 | Huang et al. | |
| 9,847,247 B2 | 12/2017 | Huang et al. | |
| 10,079,143 B2 | 9/2018 | Ting et al. | |
| 10,483,395 B2 | 11/2019 | Lin et al. | |
| 2013/0001707 A1 | 1/2013 | Lin et al. | |
| 2014/0017903 A1* | 1/2014 | Bello | ............ H01L 21/68735 438/758 |
| 2015/0064929 A1 | 3/2015 | Tseng et al. | |
| 2015/0140819 A1 | 5/2015 | Huang et al. | |

(Continued)

*Primary Examiner* — Wasiul Haider
(74) *Attorney, Agent, or Firm* — J.C. Patents

(57) ABSTRACT

The invention provides a fin structure for a fin field effect transistor, including a substrate. The substrate includes a plurality of silicon fins, wherein a top of each one of the silicon fins is a round-like shape in a cross-section view. An isolation layer is disposed on the substrate between the silicon fins at a lower portion of the silicon fins while an upper portion of the silicon fins is exposed. A stress buffer layer is disposed on a sidewall of the silicon fins between the isolation layer and the lower portion of the silicon fins. The stress buffer layer includes a nitride portion.

5 Claims, 7 Drawing Sheets

(56) References Cited

U.S. PATENT DOCUMENTS

| | | | |
|---|---|---|---|
| 2016/0247876 A1* | 8/2016 | Chung | H01L 29/0843 |
| 2017/0084616 A1* | 3/2017 | Kim | H01L 29/7854 |
| 2017/0372969 A1* | 12/2017 | Ching | H01L 21/02634 |
| 2020/0105939 A1* | 4/2020 | Kao | H01L 29/785 |
| 2021/0313428 A1* | 10/2021 | Li | H01L 21/02532 |
| 2021/0407861 A1* | 12/2021 | Savant | H01L 21/823842 |

\* cited by examiner

FIN STRUCTURE FOR FIN FIELD EFFECT TRANSISTOR AND METHOD FOR FABRICATION THE SAME

BACKGROUND OF THE INVENTION

Field of the Invention

The invention relates to a semiconductor fabrication technology, in particular, to a fin structure of fin field effect transistor and method for fabricating the fin structure.

Description of Related Art

Transistors are the main devices as to be fabricated in the integrated circuit. Usually, a large amount of transistors is involved in the integrated circuit. The size of the transistor would be a factor to determine the size of the whole circuit.

With the trend in the industry being towards scaling down the size of the metal oxide semiconductor transistors (MOS), three-dimensional or non-planar transistor technology, such as fin field effect transistor technology (FinFET) has been developed to replace planar MOS transistors.

The FinFET in three-dimensional structure includes the silicon fin which is rather thin in width and is used to provide the channel, source region and drain region of the transistor. In addition, the gap between fins may also be narrow. Due to fin structure, the size of the transistor may be significantly reduced. However, to form the thin fin structures from the substrate, the fabrication procedure would include some mask structure on top of the silicon fin to protect the thin fin in accordance with the fabrication.

How to form the fine structure of the FinFET with proper fabrication procedures is still under developing.

SUMMARY OF THE INVENTION

The invention provides a fin structure of fin field effect transistor and method for fabricating the fin structure. The fabrication may be performed with simplified mask layer on the silicon fin during fabrication to resist the polishing process. As a result, the fabrication cost may be reduced.

In an embodiment, the invention provides a fin structure for a fin field effect transistor, including a substrate. The substrate includes a plurality of silicon fins, wherein a top of each one of the silicon fins is a round-like shape in a cross-section view. An isolation layer is disposed on the substrate between the silicon fins at a lower portion of the silicon fins while an upper portion of the silicon fins is exposed. A stress buffer layer is disposed on a sidewall of the silicon fins between the isolation layer and the lower portion of the silicon fins. The stress buffer layer includes a nitride portion.

In an embodiment, as to the fin structure, the substrate includes a silicon wafer or a silicon on insulator (SOI) substrate.

In an embodiment, as to the fin structure, the isolation layer includes a flowable chemical vapor deposition (FCVD) dielectric layer.

In an embodiment, as to the fin structure, the FCVD dielectric layer includes flowable oxide.

In an embodiment, as to the fin structure, the nitride portion of the stress buffer layer is a nitriding part of the stress buffer layer.

In an embodiment, as to the fin structure, the nitride portion includes a silicon nitride portion and the stress buffer layer includes an amorphous silicon layer.

In an embodiment, as to the fin structure, it further includes an atomic layer deposition (ALD) layer between the stress buffer layer and each of the silicon fins.

In an embodiment, the invention also provides a method for fabricating a fin structure for fin field effect transistor. The method includes providing a substrate. The substrate includes a fin structure having a silicon fin and a single mask layer just on a top of the silicon fin, the single mask layer being as a top portion of the fin structure. A stress buffer layer is formed on the substrate and conformally covering over the fin structure. A nitridation treatment is performed on the stress buffer layer to have a nitride portion. A flowable deposition process is performed to form a flowable dielectric layer to cover over the fin structures. The flowable dielectric layer is annealed. The flowable dielectric layer is polished, wherein the nitride portion of the stress buffer layer is used as a polishing stop.

In an embodiment, as to the method for fabricating the fin structure, it further includes performing an etching back process on the flowable dielectric layer, the single mask layer and the stress buffer layer, to expose an upper part of the silicon fin.

In an embodiment, as to the method for fabricating the fin structure, the flowable deposition process is a flowable chemical vapor deposition (FCVD) process for flowable oxide material.

In an embodiment, as to the method for fabricating the fin structure, the substrate includes a silicon wafer or a silicon on insulator (SOI) substrate.

In an embodiment, as to the method for fabricating the fin structure, the single mask layer includes an oxide mask layer.

In an embodiment, as to the method for fabricating the fin structure, the nitride portion in the stress buffer layer is a nitriding part of the stress buffer layer due to a partial nitridation on the stress buffer layer.

In an embodiment, as to the method for fabricating the fin structure, the nitride portion is a silicon nitride portion and the stress buffer layer is an amorphous silicon layer.

In an embodiment, as to the method for fabricating the fin structure, the method further incudes forming an atomic layer deposition (ALD) layer between the stress buffer layer and each of the silicon fins.

In an embodiment, as to the method for fabricating the fin structure, the method further includes performing a dielectric etching process to expose an upper portion of the silicon fins. A top of each of the silicon fins is a round-like shape in a cross-section view due to the dielectric etching process.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention provides the manner to fabricate the Fin-FETm in which the silicon fin may be fabricated by perform partial nitridation treatment on the stress buffer film (SBF) to convert into nitride. The nitride from the stress buffer film may provide a polishing stop, so that some mask layers to protect fin may be omitted.

Multiple embodiments are provided for describing the invention but the invention is not just limited to the embodiments.

FIGS. 1A-1D are drawings, schematically illustrating a fabrication flow as looking into for forming a fin structure on a substrate in a cross-section view, according to an embodiment of the invention.

Figure 1A:
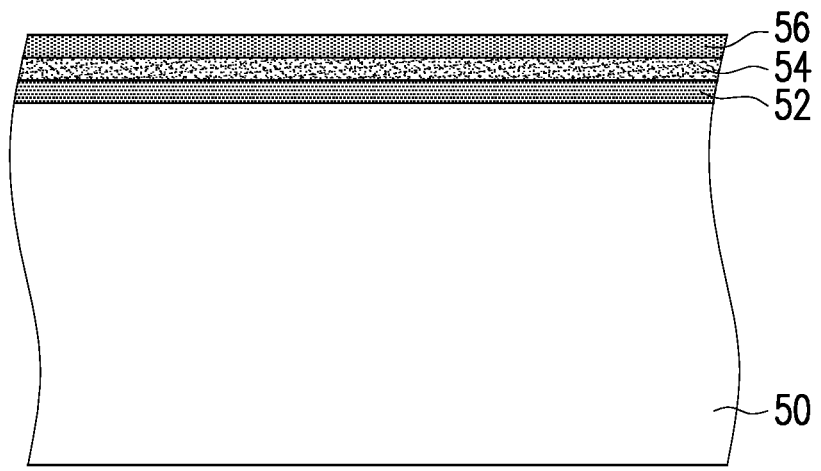
FIGS. 1A-1D are drawings, schematically illustrating a fabrication flow as looking into for forming a fin structure on a substrate in a cross-section view, according to an embodiment of the invention.

Referring to FIG. 1A, as looked into by the invention, to form the thin fins at the upper portion of the substrate 50, multiple dielectric protecting layers, including a pad oxide layer 52, a pad nitride layer 54 and an oxide mask layer 56 are sequentially formed on the substrate 50. The substrate 50 for forming the fin is silicon in an embodiment. The pad oxide layer 52, the pad nitride layer 54 and the oxide mask layer 56 in the usual manner are preliminarily formed and would be involved in the mechanism for the subsequent fin polishing and etching processes.

Figure 1B:
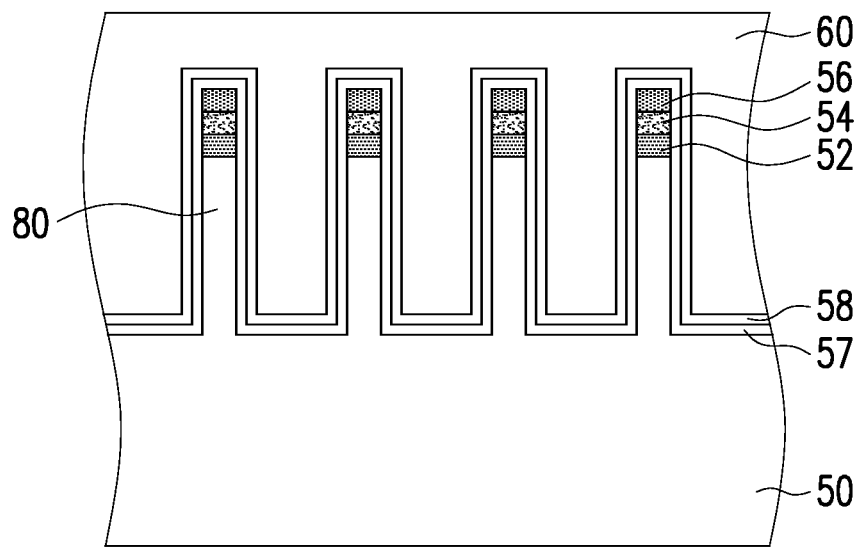

Referring to FIG. 1B, the pad oxide layer 52, the pad nitride layer 54, the oxide mask layer 56 and the substrate 50 are patterned to form the silicon fins 80, on which a residual portion of the pad oxide layer 52, the pad nitride layer 54, the oxide mask layer 56 as a stack remain on the top of the silicon fins 80. At current stage, the silicon fins 80 with the stack dielectric at top form as a fin structure. A stress buffer film (SBF) 58 is then form the formed on the substrate 50 and is conformally covering over the fin structure. In addition, before forming the SBF 58 is formed, an atomic layer deposition (ALD) layer 57 as an option may also be formed conformally covering over the fin structures.

A flowable dielectric layer 60 is formed over the substrate to cover the fin structure, which includes the pad oxide layer 52, the pad nitride layer 54, the oxide mask layer 56 and the silicon fin 80. The flowable dielectric layer 60 in an example is formed by flowable chemical vapor deposition (FCVD) process with the suitable material of oxide. The flowable dielectric layer 60 usually is annealed for curing and increasing density into a hard isolation dielectric with higher density. The SBF 58 as form of amorphous silicon may protect the silicon fin 80 from oxidation in an example and also provide the stress buffer effect to the silicon fin 8o which is thin as viewed in the cross-section structure.

Figure 1C:
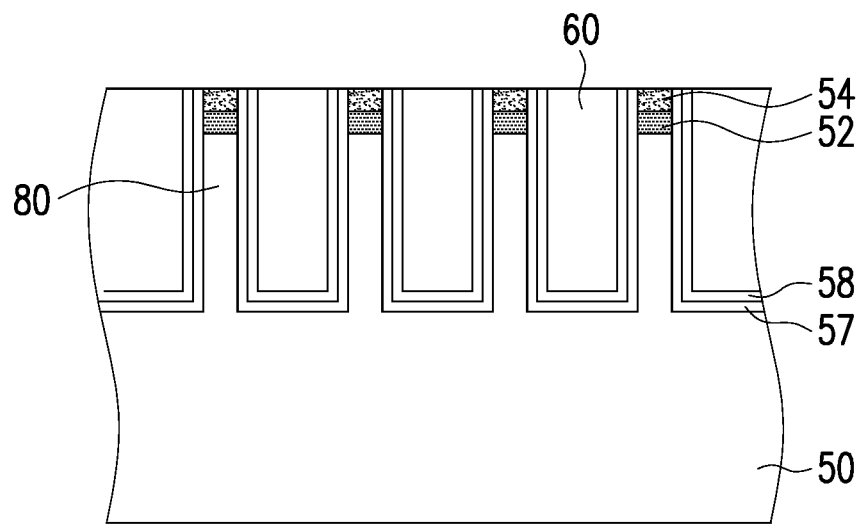

Referring to FIG. 1C, the flowable dielectric layer 60 after annealing process for curing and increasing density is polished by chemical mechanical polishing (CMP) process. In this polishing process, the nitride layer 54 may serve as the polishing stop.

Figure 1D:
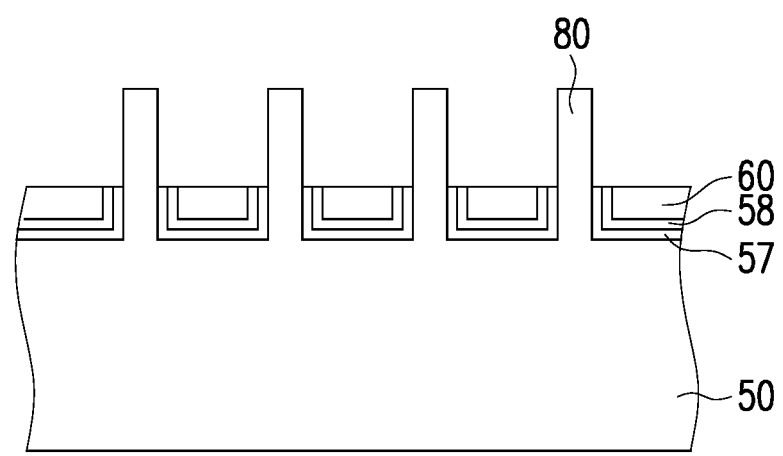

Referring to FIG. 1D, to expose the silicon fin 80, a dielectric etching process is performed to remove the upper portion of the flowable dielectric layer 60. Then, the upper portion of the silicon fin 80 is exposed to provide the fin to form the FinFET in the subsequent processes. Here, the descriptions for the subsequent fabrication processes to form the FinFET are omitted and the invention does not limit the subsequent fabrication processes.

As looked into in the invention, the pad oxide layer 52, the pad nitride layer 54, and the oxide mask layer 56 are involved, so as to provide the fin polishing stop and resist the dielectric etching process to expose the silicon fin 80.

As investigated in the invention when looking into the procedure in FIG. 1A to FIG. 1D, the pad oxide layer 52 and the pad nitride layer 54 may be skipped with slightly modification. As a result, the fabrication may be simplified and the fabrication cost may be reduced.

FIGS. 2A-2I are drawings, schematically illustrating a fabrication flow for forming a fin structure on a substrate in a cross-section view, according to an embodiment of the invention.

Figure 2A:
FIGS. 2A-2I are drawings, schematically illustrating a fabrication flow for forming a fin structure on a substrate in a cross-section view, according to an embodiment of the invention.

Referring to FIG. 2A, a substrate 100, such as a silicon wafer or a silicon on insulator (SOI) substrate is provided. The substrate 100 provide the semiconductor property to form the channel latter for the FinFET. In an embodiment, the mask layer 102 as a single layer is preliminarily formed on the substrate 100. As noted in viewing to FIG. 1A, a single mask layer is formed. The mask layer 102 is an oxide layer in an embodiment.

To form the thin fins in an embodiment, a plurality of mandrels 104 with the intended width is formed on the mask layer 102. A spacer 106 is formed on the sidewall of the mandrels 104. There, the thickness of the spacer 106 is reserved, corresponding to the width of the fin as to be formed form the FinFET.

Figure 2B:
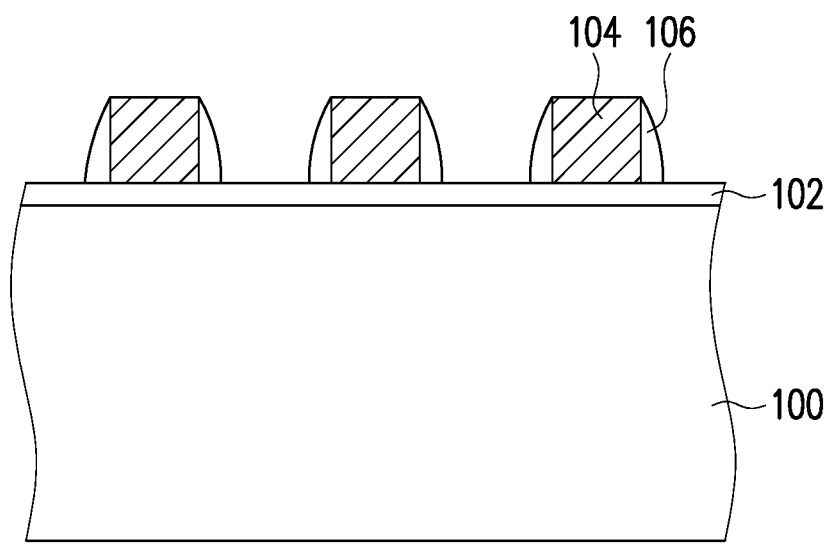
Figure 2C:
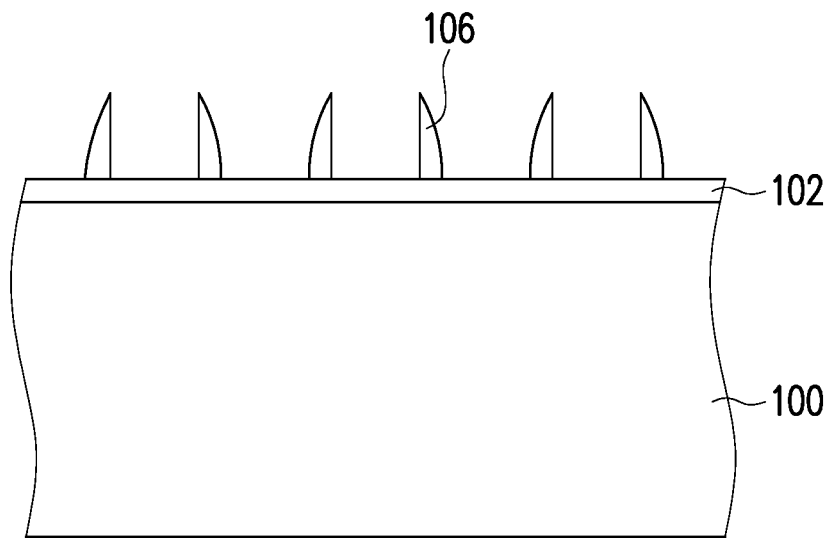

Referring to FIG. 2B, the mandrels 104 are removed while the spacer 106 remains. At this stage, a portion of the mask layer 102 as previously cover by the mandrels 104 is exposed.

Figure 2D:
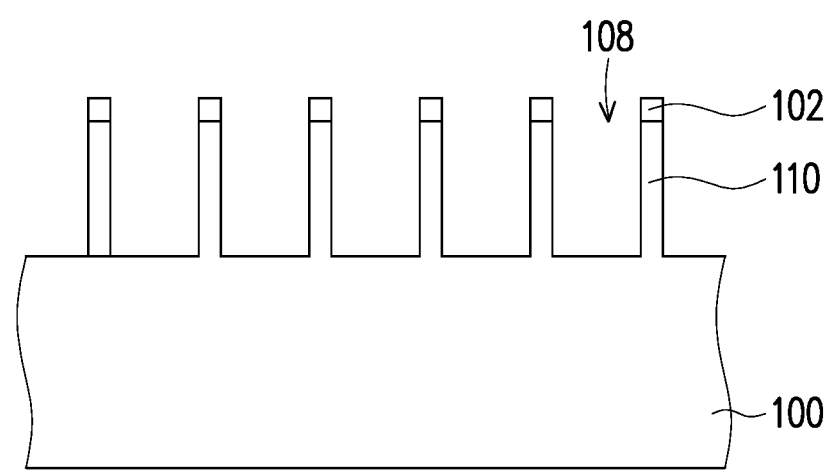

Referring to FIG. 2D, the spacer 106 is used as the etching mask to etch the substrate 100 through the mask layer 102. Due to the etching selectivity as set, the substrate 100 in silicon and the spacer 106 in oxide are etched. After etching process, the silicon fins 110 are formed at the upper portion of the substrate 100. A residual portion of the mask layer 102 is still disposed on top of the silicon fin 110. The gap between the fins form the trench 108 to expose the substrate 100 and the sidewall of the silicon fin 110.

Figure 2E:
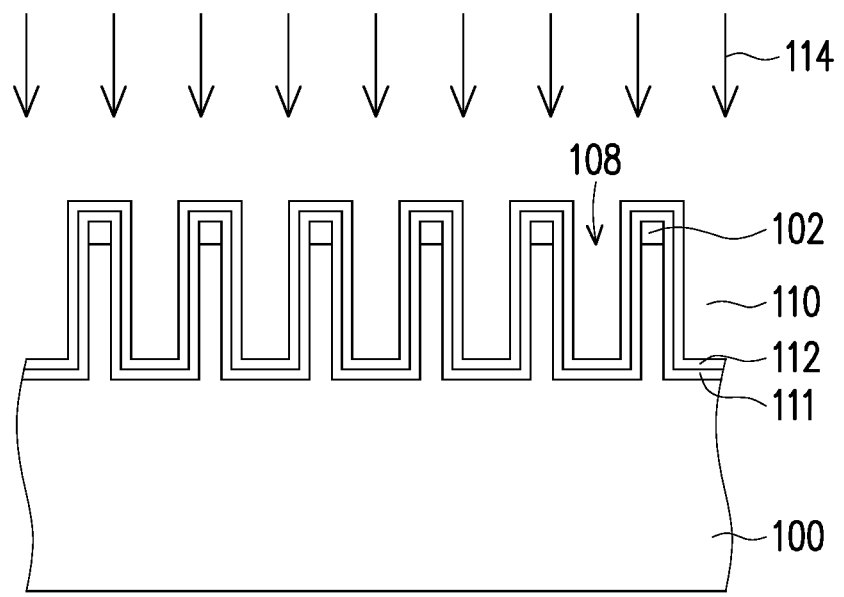

Referring to FIG. 2E, a SBF 112 is formed conformally covering over the fin structure as composed of the silicon fin 110 and the mask layer 102 at the top. As also previously stated, an ALD layer 111 as an option may be formed before forming SBF 112. The material of the SBF 112 is amorphous silicon to protect the silicon fin 110 in the subsequent annealing process at the high temperature. As noted, the thickness of the SBF 112 is actually rather thinner than the fin width. The drawing is not at the actual scale as should be noted.

In an embodiment of the invention, after the SBF 112 is formed, a nitridation treatment 114 is performed on the SBF 112. Due to the property of the amorphous silicon of the SBF 112, the SBF 112 may be partially nitridation to partially form nitride in the SBF 112.

Figure 2F:
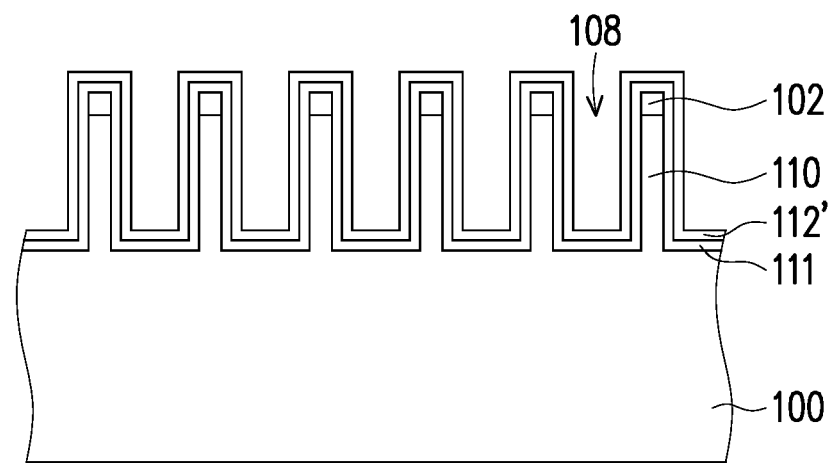

Referring to FIG. 2F, here, the SBF 112 in an embodiment is not in full nitridation to completely convert into silicon nitride. At the stage, the previous SBF 112 is then changed to the SBF 112', which partially include the nitride portion. This nitride portion may provide as the polishing stop and the silicon material as remained may resist oxidation layer to the silicon fin 110 for protection effect as to be described.

Figure 2G:
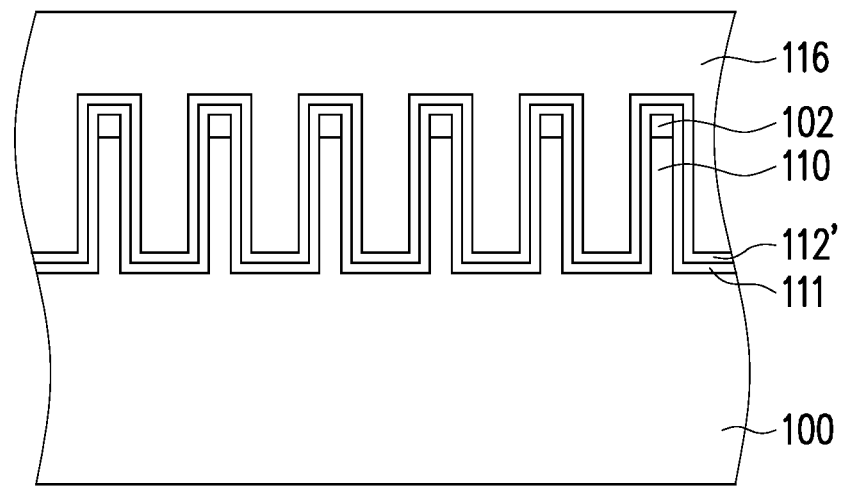

Referring to FIG. 2G, a flowable dielectric layer 116, such as flowable oxide, is formed over the substrate 100 to fully fill into the trench 108 and cover the SBF 112'. An annealing process is performed on the flowable dielectric layer 116 for curing and increasing density. The silicon material in the SBF 112' may provide the stress buffering effect on the silicon fin 110. In addition, the annealing process may also cause oxidation on the silicon material. However, the silicon fin 110 is protected by the SBF 112', which still contains silicon material. The annealing process may be oxidized the SBF 112' but significantly not on the silicon fin 110.

Figure 2H:
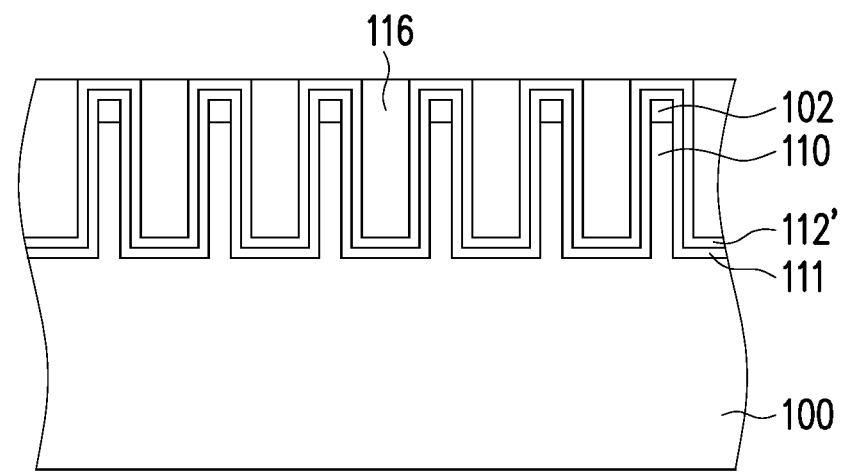

Referring to FIG. 2H, after annealing process for curing and increasing density on the flowable dielectric layer 116, the polishing process is performed over the substrate 100. It should be noted that the SBF 112' contains nitride portion due to the nitridation treatment 114 in FIG. 2E. The nitride portion may serve as the polishing stop to replace the nitride layer 54 as stated in FIG. 1C although the nitride layer 54 is not actually formed in the embodiment.

Figure 2I:
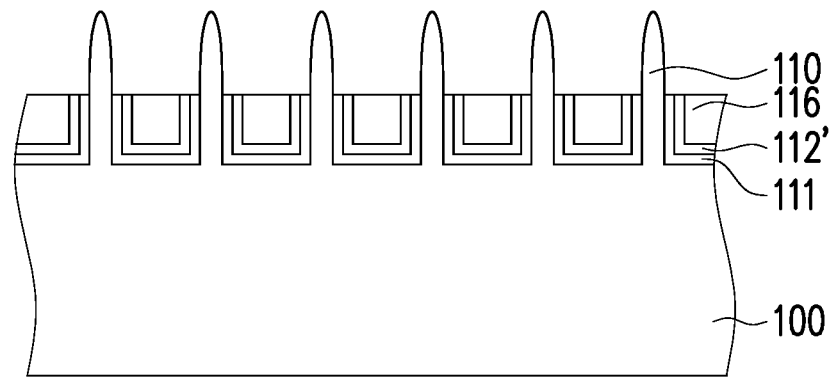

Referring to FIG. 2I, a dielectric etching process is performed to the flowable dielectric layer 116 to remove its upper portion. Also, the mask layer 102 and the SBF 112' are also removed in the same etching process. As a result, the upper portion of the silicon fin 110 is exposed to provide the fin for forming the FinFET in the subsequent fabrication process.

As noted in the fabrication procedure, the nitride layer 54 and the pad oxide layer 52, referring to FIG. 1A, are saved in the invention. In addition, the nitridation treatment 114 as referring to FIG. 2E is additionally performed on the SBF 112 to change into the SBF 112' with nitride portion to provide the polishing stop instead of the nitride layer 54.

As also noted, the SBF 112' at the lower sidewall of the silicon fin 110 contains the nitride portion. The top of the silicon fin 110 in the embodiment just has the single mask layer 102, which may be relatively weak to resist the dielectric etching process to expose the silicon fin 110. As a result, the top of the silicon fin 110 is a round-like shape as viewed in cross-section while comparing to FIG. 1D in an example. However, the round-like shape at the cross-section view does not significantly affect the channel function for the FinFET when the gate line perpendicularly crossing over the silicon fin 110, which is actually a fin line in structure as formed.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A fin structure for a fin field effect transistor, comprising:
    a substrate, including a plurality of silicon fins, wherein a top of each one of the silicon fins is a round-like shape in a cross-section view;
    an isolation layer, disposed on the substrate between the silicon fins at a lower portion of the silicon fins while an upper portion of the silicon fins is exposed;
    a stress buffer layer, disposed on sidewalls of the silicon fins between the isolation layer and the lower portion of the silicon fins, wherein the stress buffer layer is made up of a nitride portion and an amorphous silicon portion; and
    an atomic layer deposition layer, disposed between the stress buffer layer and each of the silicon fins,
    wherein a material of the nitride portion is silicon nitride,
    wherein the nitride portion is a single layer,
    wherein the amorphous silicon portion is disposed between the nitride portion and each of the silicon fins,
    wherein the top of the silicon fins is exposed by the amorphous silicon portion.

2. The fin structure as recited in claim 1, wherein the substrate includes a silicon wafer or a silicon on insulator (SOI) substrate.

3. The fin structure as recited in claim 1, wherein the isolation layer includes a flowable chemical vapor deposition (FCVD) dielectric layer.

4. The fin structure as recited in claim 3, wherein the FCVD dielectric layer includes flowable oxide.

5. The fin structure as recited in claim 1, wherein the nitride portion of the stress buffer layer is a nitriding part of the stress buffer layer.

* * * * *